(12) United States Patent
Rupich et al.

(10) Patent No.: US 7,582,328 B2
(45) Date of Patent: Sep. 1, 2009

(54) DROPWISE DEPOSITION OF A PATTERNED OXIDE SUPERCONDUCTOR

(75) Inventors: Martin W. Rupich, Framingham, MA (US); Cornelis L. Thieme, Westborough, MA (US)

(73) Assignee: American Superconductor Corporation, Westborough, MA (US)

( * ) Notice: Subject to any disclaimer, the term of this patent is extended or adjusted under 35 U.S.C. 154(b) by 792 days.

(21) Appl. No.: 10/955,866

(22) Filed: Sep. 29, 2004

(65) Prior Publication Data
US 2006/0040829 A1 Feb. 23, 2006

Related U.S. Application Data

(60) Provisional application No. 60/603,202, filed on Aug. 20, 2004.

(51) Int. Cl.
*B05D 5/12* (2006.01)
*C23C 14/00* (2006.01)
*H01L 39/24* (2006.01)

(52) U.S. Cl. .................... 427/62; 204/192.24; 505/434; 505/470; 505/740; 505/741

(58) Field of Classification Search .................. 427/62; 204/192.24; 505/434, 470, 740, 741
See application file for complete search history.

(56) References Cited

U.S. PATENT DOCUMENTS

| | | | |
|---|---|---|---|
| 5,206,216 A * | 4/1993 | Yoshida | 505/434 |
| 5,231,074 A | 7/1993 | Cima et al. | |
| 5,683,967 A | 11/1997 | Frenkel | |
| 5,908,812 A | 6/1999 | Cotton et al. | |
| 6,022,832 A | 2/2000 | Fritzemeier et al. | |
| 6,027,564 A | 2/2000 | Fritzemeier et al. | |
| 6,055,446 A * | 4/2000 | Kroeger et al. | 505/230 |
| 6,077,344 A | 6/2000 | Schoup et al. | |
| 6,190,752 B1 | 2/2001 | Do et al. | |
| 6,258,754 B1 | 7/2001 | Sengupta | |
| 6,399,154 B1 | 6/2002 | Williams et al. | |
| 6,436,317 B1 | 8/2002 | Malozemoff et al. | |

(Continued)

FOREIGN PATENT DOCUMENTS

JP 01111714 A * 4/1989

(Continued)

OTHER PUBLICATIONS

IBM Technical Disclosure Bulletin, vol. 37, Issue No. 3, pp. 493-496, Mar. 1994, "Temperature-Selectable Superconductive Wire".*

(Continued)

*Primary Examiner*—Brian K Talbot
(74) *Attorney, Agent, or Firm*—Wilmer Cutler Pickering Hale & Dorr LLP.

(57) ABSTRACT

An oxide superconductor article having an oxide superconductor layer of a predetermined pattern is prepared by continuously advancing a wire having a textured surface into a deposition zone, dispensing droplets of a precursor solution to an oxide superconductor from a reservoir and the depositing droplets onto the textured surface of the wire that is introduced into the deposition zone, heating the wire or tape in the reaction zone under conditions to convert the precursor solution into an oxide superconductor; and collecting the wire after heating.

15 Claims, 11 Drawing Sheets

U.S. PATENT DOCUMENTS

| | | | |
|---|---|---|---|
| 6,440,211 | B1 | 8/2002 | Beach et al. |
| 6,493,411 | B1 | 12/2002 | Chu et al. |
| 6,498,302 | B2 | 12/2002 | Kaneko et al. |
| 6,510,604 | B1 | 1/2003 | Pourrahimi |
| 6,525,002 | B1 | 2/2003 | Weinstein |
| 6,552,415 | B1 | 4/2003 | Paul et al. |
| 6,562,761 | B1 | 5/2003 | Fritzemeier et al. |
| 6,569,811 | B1 | 5/2003 | Shi |
| 6,602,588 | B1 | 8/2003 | Kwon et al. |
| 6,617,284 | B1 | 9/2003 | Rokhvarger et al. |
| 6,624,122 | B1 | 9/2003 | Holesinger et al. |
| 6,669,774 | B1 | 12/2003 | Zhang et al. |
| 6,673,387 | B1 | 1/2004 | Zhang et al. |
| 6,706,234 | B2 * | 3/2004 | Huang ........................ 264/435 |
| 6,716,545 | B1 | 4/2004 | Holesinger et al. |
| 6,725,071 | B2 | 4/2004 | Albrecht et al. |
| 6,765,151 | B2 | 7/2004 | Fritzemeier et al. |
| 6,797,313 | B2 | 9/2004 | Fritzemeier et al. |
| 6,893,732 | B1 | 5/2005 | Fritzemeier et al. |
| 6,918,172 | B2 | 7/2005 | Wong |
| 6,974,501 | B1 | 12/2005 | Zhang et al. |
| 2002/0056401 | A1 | 5/2002 | Rupich et al. |
| 2002/0178999 | A1 | 12/2002 | Beach et al. |
| 2005/0065035 | A1 | 3/2005 | Rupich et al. |
| 2007/0145100 | A1 | 6/2007 | Suzuki et al. |

FOREIGN PATENT DOCUMENTS

| | | | |
|---|---|---|---|
| JP | 02103818 | A * | 4/1990 |
| WO | WO-98/58415 | | 12/1998 |
| WO | WO-99/16941 | | 4/1999 |
| WO | WO-99/17307 | | 4/1999 |
| WO | WO-00/58044 | | 10/2000 |
| WO | WO-00/58530 | | 10/2000 |
| WO | WO-01/08169 | | 2/2001 |
| WO | WO-01/08170 | | 2/2001 |
| WO | WO-01/08231 | | 2/2001 |
| WO | WO-01/08232 | | 2/2001 |
| WO | WO-01/08233 | | 2/2001 |
| WO | WO-01/08235 | | 2/2001 |
| WO | WO-01/08236 | | 2/2001 |
| WO | WO-01/11428 | | 2/2001 |
| WO | WO-01/15245 | | 3/2001 |
| WO | WO-01/26164 | | 4/2001 |
| WO | WO-01/26165 | | 4/2001 |
| WO | WO-02/35615 | | 5/2002 |

OTHER PUBLICATIONS

Ashworth, Los Alamos National Laboratory, "AC Losses in Coated Conductors", Superconductivity for Electric Systems Annual Peer Review, Washington, DC Jul. 27-29, 2004.
U.S. Patent and Trademark Office, International Search Report mailed Sep. 5, 2006, 3 pages.
U.S. Patent and Trademark Office, International Search Report mail Aug. 16, 2006, 3 pages.
U.S. Appl. No. 60/309,116, filed Jul. 31, 2001, Fritzemeier et al.
U.S. Appl. No. 60/308,957, filed Jul. 31, 2001, Fritzemeier.
U.S. Appl. No. 60/166,297, filed Nov. 18, 1999, Fritzemeier et al.
U.S. Appl. No. 60/477,613, filed Jun. 10, 2003, Rupich et al.
Ashworth, et al., "AC Losses in Silver Clad Tc Superconducting Tapes," Chinese Journal of Physics, 1996, vol. 34(2-11), pp. 232-242.
Babu, et al., "New Chemically Stable, Nano-Size Artificial Flux Pinning Centres in (RE)-Ba-Cu-O Superconductors," Superconductor Sci. and Tech., 2003, vol. 16, L44-L45.
Beach, et al., "Sol-Gel Synthesis of Rare Earth Aluminate Films as Buffer Layers for High $T_c$ Superconducting Films," Mat. Res. Soc. Symp. Proc., 1998, vol. 495, pp. 263-270.
Carr, et al., "Filamentary YBCO Conductors for AC Applications," I.E.E.E. Transactions on Applied Superconductivity, 1999, vol. 9(2), pp. 1475-1478.
Chevtchenko et al., "Proposal to Convert a Second-Generation High Temperature Superconducting DC tape into an AC Tape," 6 pp.
di Uccio et al., "Phase Competition Between $Y_2BaCuO_5$ and $Y_2O_3$ Precipitates in Y-rich YBCO Thin Films," Physica C, 1999, vol. 321, pp. 162-176.
Gammel et al., Observation of Hexagonally Correlated Flux Quanta in $YBa_2Cu_3O_7$, Phys. Rev. Lett., 1987, vol. 59(22), pp. 2592.-2595.
Glowacki, et al., "A New Method for Decreasing Transport AC Losses in Multifilamentary Coated Superconductors," Physica C, 2001, vol. 357-360., pp. 1213-1217.
Haugan et al., "Island Growth of $Y_2BaCuO_5$ Nanoparticles in $(211_{\sim 1.5nm/123 \sim 10mn}) \times N$ Composite Multilayer Structures to Enhance Flux Pinning of $YBa_2Cu_3O_{7-\delta}$ Films," J. Mater. Res., 2003, vol. 18(11), pp. 2618-2623.
Huang, "Oxide Barriers and Their Effect on AC Losses of Bi,Pb (2223) Multifilamentary Tapes," 1998, Applied Superconductivity Conference.
Jin et al., "Superconducting Properties of $YBa_2Cu_3O_{7-\delta}$ with Partial Rare Earth Substitution," Physica C, 1991, vol. 173, pp. 75-79.
Kehl, "The Principles of Metallographic Laboratory Practice," Third Edition, 1949, McGraw-Hill Book Company.
Lee et al., "Alternative Buffer Architectures for High Critical Current Density YBCO Superconducting Deposits on Rolling Assisted Biaxially-Textured Substrates," Jpn. J. Appl. Phys., 1999, vol. 38, pp. L178-L180.
MacManus-Driscoll et al., "Strongly Enhanced Current Densitites in Superconducting Coated Conductors of $BaZrO_3$-Doped $YBa_2Cu_3O_{7-x}$," Superconductivity Tech. Center, Los Alamos Nat'l Lab., pp. 1-7.
Majoros, et al., "Modelling of the Influence of Magnetic Screening on Minimisation of Transport AC Losses in Multifilamentary Superconductors," I.E.E.E. Transactions on Applied Superconductivity, 2001, vol. 1(1), pp. 2780-2783.
Malozemoff, "Second Generation HTS Wire: An Assessment," 2004, American Superconductor Brochure.
Morrell et al., Sol-Gel Synthesis of Epitaxial Films of (Sr, Ba) $Bi_2(Nb,Ta)_2O_9$ and $Bi_4Ti_3O_{12}$ on [100] $SrTiO_3$, Mat. Res. Soc. Symp. Proc., 1998, vol. 495, pp. 271-276.
Oberly, et al., "AC Loss Analysis for Superconducting Generator Armatures Wound with Subdivided Y-Ba-$C_4$-O Coated Tape," Cryogenics, 2001, vol. 41, pp. 117-124.
Oomen, et al., "AC Loss in High-Temperature Superconducting Conductors, Cables, and Windings for Power Devices," Superconductor Science and Technology, 2004, vol. 17, pp. S394-S399.
Paranthaman et al., "Growth of Biaxially Textured $RE_2O_3$ Buffer Layers on Rolled-Ni Substrates Using Reactive Evaporation for HTS-Coated Conductors," Superconductor Sci. Tech., 1999, vol. 12, pp. 319-325.
Rupich et al., "Growth and Characterization of Oxide Buffer Layers for YBCO Coated Conductors," I.E.E.E. Trans. on Appl. Supercon., 1999, vol. 9(2), pp. 1527-1530.
Shoup et al., "Epitaxial Thin Film Growth of Lanthanum and Neodymiun Aluminate Films on Roll-Textured Nickel Using a Sol-Gel Method," J. Am. Cer. Soc., 1998, vol. 81, pp. 3019-3021.
Skakle "Crystal Chemical Substitutions and Doping of $YBa_2Cu_3O_x$ and Related Superconductors," Materials Science and Engineering, 1998, vol. R23, pp. 1-40.
Wolf, et al., "Silicon Processing for the VLSI Era," 1986, vol. 1, pp. 539-574, Lattice Press, Sunset Park, CA.
Wu, et al., "Twin Boundaries and Critical Current Densities of $YBa_2Cu_3O_7$ Thick Films Fabricated by the $BaF_2$ Process," Superconductor Sci. and Tech., 2003, vol. 16, pp. 1127-1133.
Glowacki, "Preparation of $Bi_2Sr_2CaCu_2O_{8-x}$ tracks and thick films by jet printing", IOP Publishing Ltd. 2000, pp. 584-591.
American Superconductor Corporation, Proposal No. D045-002-0013, Topic No. ST041-002, "Indentification and Significance of the Problem or Opportunity," 21 pages.
Creagh et al., "Design and Performance of Inkjet Print Heads for Non-Graphic-Arts Applications," MRS Bulletin, Nov. 2003, pp. 807-811.
Sirringhaus, et al., "Injet Printing of Functional Materials," MRS Bulletin, Nov. 2003, pp. 802-806.

Shimoda, et al., "Inkjet Printing of Light-Emitting Polymer Displays," MRS Bulletin, Nov. 2003, pp. 821-827.

Burns, et al., "Inkjet Printing of Polymer Thin-Film Transistor Circuits," MRS Bulletin, Nov. 2003, pp. 829-834.

Derby et al., "Inkjet Printing of Highly Loaded Particulate Suspensions," MRS Bulletin, Nov. 2003, pp. 815-818.

George A Levin, "Concept of Multiply Connected Superconducting Tapes," AFOSR MURI Workshop on Coated Conductors, Jan. 21, 2004, 38 pages.

Paul N. Barnes, PH.D., "AC Loss Reduction," AFOSR Review, Jan. 19-21, 2004, 16 pages.

American Superconductor Oak Ridge National Laboratory, "Low-Cost Fabrication of 2G Wire for AC Applications," SuperHyPe Program Review, Jan. 10, 2005, 12 pages.

* cited by examiner

C. E. Oberly, L. Long, G. L. Rhoads and W. J. Carr Jr. Cyrogenics, 41, 117-124 (2001)

DROPWISE DEPOSITION OF A PATTERNED OXIDE SUPERCONDUCTOR

RELATED APPLICATIONS

This application claims the benefit of priority under 35 U.S.C. § 119(e) from copending U.S. Application Ser. No. 60/603,202, filed Aug. 20, 2004, and entitled "Dropwise Deposition Of A Patterned Oxide Superconductor," which is hereby incorporated in its entirety by reference.

This application is related to copending applications United States Application Serial No. TBD, filed on event date herewith and entitled "Stacked Filamentary Coated Superconductors," and United States Application Serial No. TBD, filed on event date herewith and entitled "Low Ac Loss Filamentary Coated Superconductors," which are hereby incorporated by reference.

BACKGROUND

1. Field of the Invention

This invention relates to multilayer articles having a patterned layer. The invention further relates to a method for directly depositing a patterned layer onto a substrate. The invention also relates to superconductor articles suitable for use in alternating current (ac) and time varying magnetic field applications.

2. Background of the Invention

Since the discovery of high-temperature superconducting (HTS) materials (superconducting above the liquid nitrogen temperature of 77 K) there have been efforts to develop various engineering applications using such HTS materials. In thin film superconductor devices and wires, significant progress has been made with fabrication of devices utilizing an oxide superconductor including yttrium, barium, copper and oxygen in the well-known basic composition of $YBa_2Cu_3O_{7-x}$ (hereinafter referred to as "YBCO"). Biaxially textured superconducting metal oxides, such as YBCO, have achieved high critical current densities in a coated conductor architecture, often referred to as second generation HTS wires, or a "coated conductor." The expression "HTS wire" indicates a HTS conductor with the attributes that make it useful for the construction of a superconducting device; its cross-sectional geometry can vary from wire-like to round.

Typically, second generation HTS wires 10 include a metal substrate 11, buffer layer(s) 12, and an active layer 13, e.g., a superconductor, as illustrated in FIG. 1. The metal substrate, such as Ni, Ag, or Ni alloys, provides flexibility for the article and can be fabricated over long lengths and large areas. Metal oxide layers, such as $LaAlO_3$, $Y_2O_3$, $CeO_2$, or yttria-stabilized zirconia (YSZ), make up the next layer and serve as chemical barriers between the metal substrate and the active layer. The buffer layer(s) can be more resistant to oxidation than the substrate and can reduce the diffusion of chemical species between the substrate and the superconductor layer. Moreover, the buffer layer(s) can have a coefficient of thermal expansion that is well matched with the superconductor material.

To achieve high critical current densities in the wire, the superconducting material is biaxially textured. As used herein, "biaxially textured" refers to a surface for which the crystal grains are in close alignment with a direction in the plane of the surface and a direction perpendicular to the surface. One type of biaxially textured surface is a cube textured surface, in which the crystal grains are also in close alignment with a direction perpendicular to the surface.

Typically, the buffer layer is an epitaxial layer, that is, its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer.

Second generation HTS wire can be incorporated into a variety of devices for many applications, including cables, motors, generators, synchronous condensers, transformers, current limiters, and magnet systems. The incorporation of second generation superconducting YBCO wires into such devices provides the opportunity to dramatically reduce the device cooling requirements, thus enabling the development of lightweight, compact, high-power sources.

Many potential applications for HTS wires involve operating the superconductor in the presence of ramped magnetic or oscillating magnetic fields, or require that the HTS wire carry alternating current. In the presence of time-varying magnetic fields or currents, there are a variety of mechanisms that give rise to energy dissipation, hereinafter referred to as "ac losses." Although second generation HTS wire is currently suitable for many types of electric power devices, including motors and power transmission cables, the ac losses from the current HTS wires are too high for use in many applications currently under development. Currently a wide, e.g., several millimeters, tape configuration is used to reach practical electrical currents. For such superconductor widths even a moderate ac frequency and magnetic field perpendicular to the superconducting film plane can produce very large ac losses.

SUMMARY

The present invention is directed to forming a patterned oxide superconductor using precursor solution inks. Second generation HTS wires are provided having a conductor architecture with reduced ac losses.

In one aspect of the invention, dropwise deposition of a precursor solution is used to form a predetermined pattern that substantially spans the length (and optionally the width) of a second generation HTS tape.

In one aspect, a method of preparing a superconducting article includes providing a precursor solution comprising precursor components to a rare earth-alkaline earth metal-transition metal oxide solubilized in one or more solvents; depositing the precursor solution as droplets onto a target surface in a pre-determined pattern, wherein the target surface includes a textured surface of a wire; and converting the deposited precursor solution into an oxide superconductor.

In one or more embodiments, the precursor solution is deposited to form an array of filaments extending substantially continuously along the length of the wire.

In one or more embodiments, the filaments are substantially parallel, transposed, have curvature, or are in the form of a sinusoidal curve.

In one or more embodiments, the filaments have a width in the range of about 20 to 1000 µm and a length extending substantially the entire length of the substrate.

In one or more embodiments, the filaments of the filament array are spaced apart to form a distance between adjacent filaments in the range of about 10 to 100 µm. The filaments can be mechanically isolated from each other.

In one or more embodiments, the precursor solution is also deposited as droplets to form at least one superconducting or conducting bridge between adjacent filaments of the filament array. The bridges can be periodically located along the length of adjacent filaments of the filament array.

In one or more embodiments, a second solution can be deposited as droplets to form at least one bridge between adjacent filaments of the filament array. The second solution can include a conductive component or precursor thereto. The bridges can be periodically located along the length of adjacent filaments of the filament array.

In one or more embodiments, the precursor solution is deposited by inkjet printing, such as by ejecting a jet of precursor solution through an orifice, or by ejecting a droplet of the precursor solution through an orifice.

In one or more embodiments, the rare earth-alkaline earth-transition metal oxide is yttrium-barium-copper oxide. The precursor components can be a salt of a rare earth element, a salt of an alkaline earth metal, and a salt of a transition metal, wherein at least one of the salts is a fluoride-containing salt.

In one or more embodiments, the solvent is removed from the deposited precursor solution prior to converting the precursor component into an oxide superconductor. The step of converting the precursor solution into an oxide superconductor includes treating the precursor film to form an intermediate metal oxyfluoride film including the rare earth, the alkaline earth metal, and the transition metal of the precursor solution; and converting the oxyfluoride film into an oxide superconductor.

In one or more embodiments, the wire is a multilayered structure. The multilayer structure includes a textured barrier layer on a metal base. The multilayer substrate further includes a textured cap layer. The oxide superconductor has a c-axis orientation that is substantially constant across its width, the c-axis orientation of the superconductor being substantially perpendicular to the surface of the wire or tape.

In one or more embodiments, a second solution including a second material is deposited as droplets over the target surface. The second solution can be deposited over an exposed portion of the target surface or over the deposited precursor component. The precursor components and the second material can be reacted to form a reaction product having a lower conductivity than the oxide superconductor.

In one or more embodiments, a second solution including a second material is deposited between at least two adjacent filaments of the filament array. The second material can be an insulating material or precursor thereto, or a non-superconducting material or precursor thereto, a medium to high resistivity material, or a poorly conducting material In one aspect of the invention, a method of preparing a superconducting article includes providing a precursor solution comprising precursor components to a rare earth-alkaline earth metal-transition metal oxide solubilized in one or more solvents; depositing the precursor solution as droplets onto a textured surface of a wire to form a substantially continuous coating on the textured surface over length of the wire; and converting the deposited precursor solution into an oxide superconductor. The precursor solution is deposited by inkjet printing, such as by ejecting a jet of precursor solution through an orifice or by ejecting a droplet of the precursor solution through an orifice. In one or more embodiments, the precursor solution is deposited from a plurality of inkjet printing head.

In one or more embodiments, a second solution is applied on the continuous coating in a predetermined pattern, and the second coating includes a material capable of poisoning an oxide superconductor, and the precursor solution and the second solution are reacted under conditions to form a reaction product having a critical current density less than the oxide superconductor.

In another aspect, a method for preparing an oxide superconductor article having an oxide superconductor layer of a predetermined pattern includes continuously advancing a wire or tape having a textured surface into a deposition zone; dispensing droplets of a precursor solution to an oxide superconductor from a reservoir and the depositing droplets onto the textured surface of the wire that is introduced into the deposition zone; heating the wire in the reaction zone under conditions to convert the precursor solution into an oxide superconductor; and collecting the wire or tape after heating. The droplets can be generated using an inkjet printing head.

In another aspect, a system for preparing an oxide superconductor article having an oxide superconductor layer of a predetermined pattern includes a feeder for continuously advancing a continuous length of substrate into a deposition zone; a reservoir for holding a precursor solution to an oxide superconductor; dropwise dispenser for discharging and depositing droplets of a precursor solution onto a tape or wire that is introduced into the deposition zone; a motor for continuously advancing a tape or wire into a reaction zone; a heater in the reaction zone capable of temperature and atmosphere control; and up-take roll for continuously collecting a continuous length of substrate. The dropwise dispenser can be an inkjet printing head. The inkjet printing head can include a continuous jet printing head or a drop-on-demand printing head. In one or more embodiments, the system further includes a dryer for removing the solvent from a deposited precursor solution.

Another general aspect of the invention includes an article having a substrate having a textured surface and a patterned oxyfluoride layer deposited over the textured surface of the substrate. The oxyfluoride layer includes the constituent metals of an oxide superconductor. The pattern includes a plurality of filaments extending substantially continuously along the length of the article.

In another aspect of the invention, a method of making a superconducting article includes depositing a first layer on a target surface, the first deposition step including depositing a precursor solution comprising precursor components to an oxide superconductor solubilized in one or more solvents (or a suspension or slurry of oxide superconducting particles) as droplets onto an exposed area of the target surface; depositing a second layer on the first layer, the second layer including an insulating or high resistivity material or precursor thereto covering at least a portion of the first layer; and depositing a third layer on an underlying layer, the third deposition step including depositing a precursor solution comprising precursor components to an oxide superconductor solubilized in one or more solvents (or a suspension or slurry of oxide superconducting particles) as droplets onto an exposed area of the underlying layer. Dropwise deposition can be inkjet printing, such as by ejecting a jet of precursor solution through an orifice or by ejecting a droplet of the precursor solution through an orifice. The precursor solution can be deposited from a plurality of inkjet printing head.

In one or more embodiments, the method further includes depositing a second solution including a second material as droplets on an exposed area of the target surface. The second material is an insulating or high or medium resistivity material or precursor thereto.

By "dropwise" it is meant that the material is deposited in the form of drops. The actual size of the drops will vary.

BRIEF DESCRIPTION OF THE DRAWING

The invention is described with reference to the following figures, which are presented for the purpose of illustration only and which are not intended to be limiting of the invention.

DETAILED DESCRIPTION

The total ac loss in a superconducting oxide film is proportional to the film width and the perpendicular magnetic field component, that is, the component of the transverse magnetic field that is perpendicular to the film wide face. Reducing the film width leads to a decrease in the total ac loss. Dividing an oxide superconducting film into narrow filaments can therefore suppress ac loss in a superconducting oxide thin film.

Figure 1:
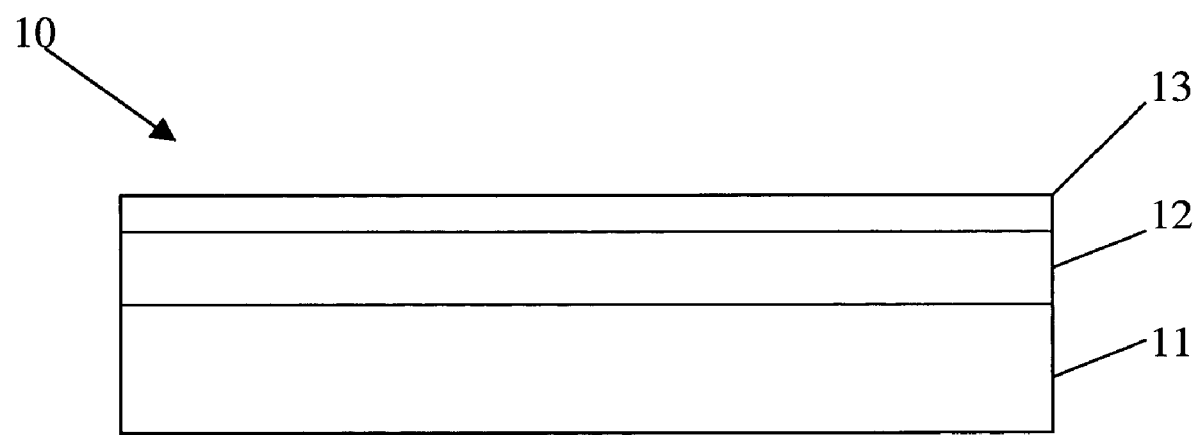
FIG. 1 is a cross-sectional view of a typical superconductor article.
Figure 2:
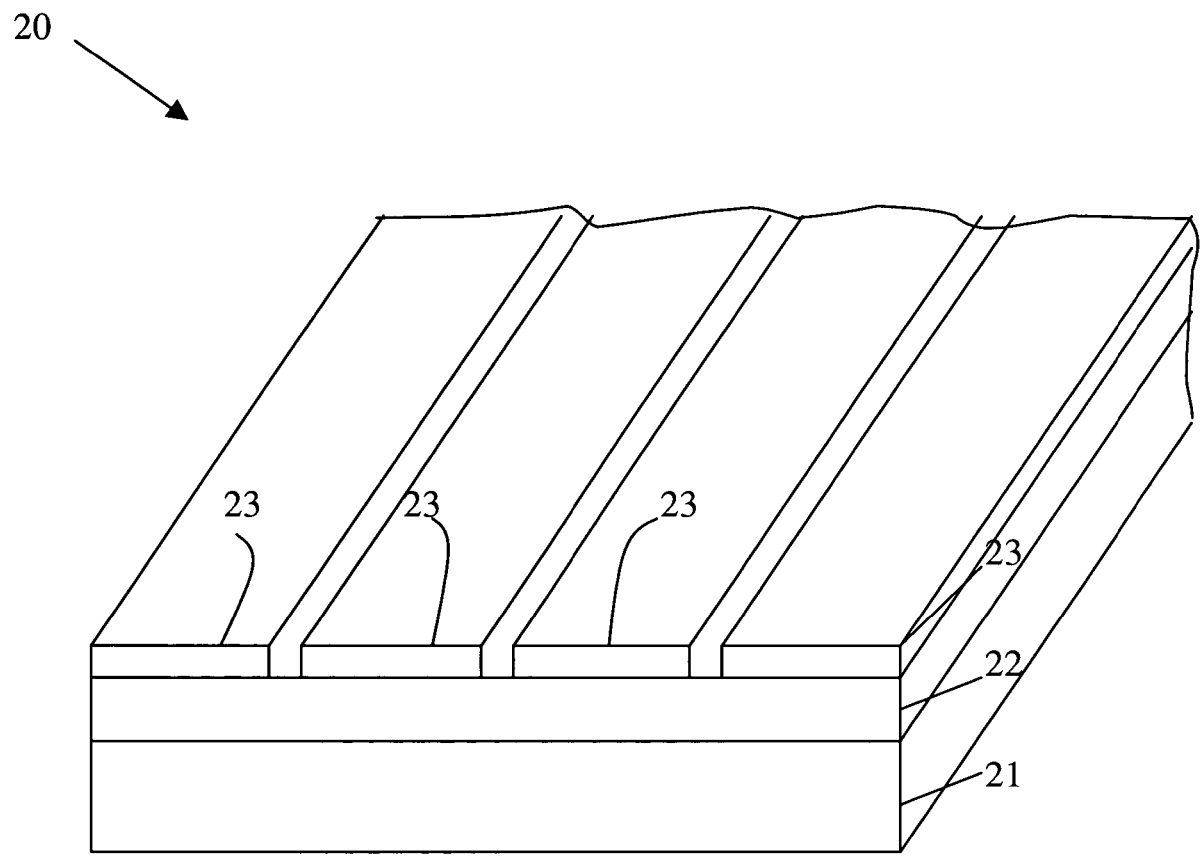
FIG. 2 is a perspective view of a coated conductor article, in which the YBCO film is arranged as a thin filament array.

An exemplary superconducting article having reduced ac losses includes a wire or tape having a textured surface and an array of superconducting oxide filaments extending substantially continuously along the length of the textured surface of the wire or tape, wherein the filaments are electrically isolated from one another along their length. FIG. 2 is a cross-sectional view of a coated conductor article, in which the YBCO film is arranged as a thin filament array. The multilayer article 20 includes a metal substrate 21 having a textured surface and epitaxially grown buffer layer(s) 22. Such textured bases have been previously described. A RABiTS™ (rolling-assisted, biaxially textured substrates) textured template is typically used. A RABiTS™ substrate is a roll-textured and annealed metal tape, e.g., nickel, covered with one or more oxide or metal buffer or conditioning layers. Another variation used to prepare the textured template is ion beam assisted deposition or IBAD. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $LaNiO_3$, $Gd_2O_3$, $LaCuO_3$, $SrRuO_3$, $NdGaO_3$, $NdAlO_3$ and nitrides as known in the art. The resulting textured base serves as a template for the HTS compound, e.g., yttrium-barium-copper-oxide (YBCO) or alternatively with a rare earth substituted for the Y.

Superconductor filaments 23 run substantially continuously along the length of the tape and form an array of substantially parallel filaments. Superconducting filaments are crystallographically oriented and typically exhibit biaxial texture.

Figure 3:
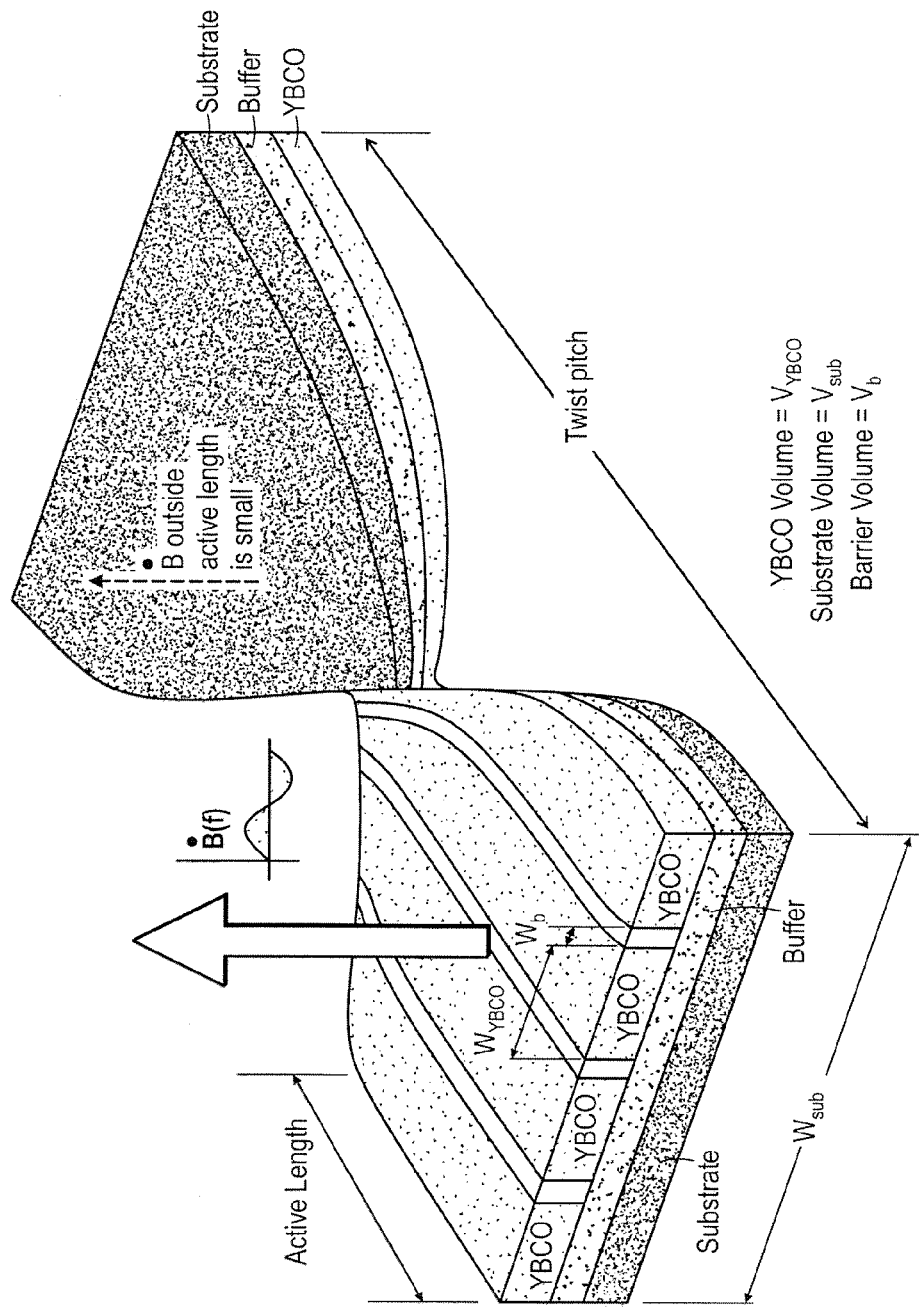
FIG. 3 is a schematic illustration of a twisted coated conductor with minimized ac loss.

The thin filament arrays of coated conductor are then twisted to make an electrical wire with low ac loss as shown in FIG. 3. While reducing ac losses, the use of narrow filaments also lowers the effective current density of the whole wire due to the concommittent reduction of HTS material within the wire. Therefore, the multifilament architecture, e.g., filament width and the barrier spacing, is selected to optimize the critical current density while minimizing ac loss. This can be accomplished by use of deposition methods that provide a high degree of precision and control in forming the superconducting oxide layer.

According to one or more embodiments of the present invention, a method for making a patterned superconducting oxide article is provided that is capable of precisely depositing superconductor material (or precursor thereto), without damage to the underlying layers of the article or to the deposited active superconducting material. The method uses the controlled deposition of droplets of a solution, e.g., dropwise deposition, containing precursor components to an oxide superconductor to precisely form a patterned layer on a substrate. The patterned layer is then converted into a patterned oxide superconductor. The method may be used to deposit virtually any pattern. The method may be used to deposit a plurality of narrow strips of oxide superconductor, which have been demonstrated to significantly suppress the ac loss of second generation coated conductor articles. However, the method is not limited to the deposition of a filament array for the reduction of ac losses.

Although the methods are described with reference to a precursor solution to an oxide superconductor, it is also contemplated that the processing steps may be employed with a particle suspension or dispersion of oxide superconductor. These methods would provide complex oxide superconductor patterns such as the ones described herein prepared using solution deposition of precursor materials.

In an exemplary method, precursor components to an oxide superconductor are dissolved in a suitable solvent to form a solution. A precursor component includes a metal source, e.g., a metal salt, metal compound and metal-organic compound and the like, that can be further processed (along with other precursor components) to form an oxide superconductor. The precursor components can include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. A typical precursor solution includes the salts of yttrium, barium and copper, wherein at least one of the metal salts is a trifluoroacetate. The solvent or combination of solvents used in the precursor solution can include any solvent or combination of solvents capable of dissolving the metal sources. Such solvents include, for example, water and alcohols, including methanol, ethanol, isopropanol and butanol.

The solution is introduced into a dispensing device that has at least one nozzle through which the solution may be discharged, continuously or intermittently on demand, in the form of discrete fine droplets. The precursor solution may be dispensed through a plurality of dispensing devices and/or through a plurality of nozzles or nozzle orifices. The dispensed precursor solution is deposited onto a textured target surface essentially point by point to form a thin film in a predetermined pattern. Thus, a high degree of precision can be realized.

Concurrent with or after deposition, the deposited patterned precursor solution is dried to remove the solvent. A continuous film deposited by conventional deposition techniques, e.g., spin coating or slot die coating, typically has long drying times, i.e., several minutes. In contrast, dropwise patterned films dry almost instantaneously, i.e., about 100 to 200 msec. In one or more embodiments, the patterned precursor layer is dried by passing the wire through a heat source, such as an IR lamp. The drying rate of dropwise deposited patterned films can be controlled, for example, by controlling the vapor pressure over the film surface. Modification of solvent properties, adjustment of deposition speed and overlapping of deposited droplets are additional or alternative techniques that can be used to control droplet drying rate and other film properties.

The precursor components are then heated to convert the precursors into an oxide superconductor. Exemplary precursor components include a salt of a rare earth element, a salt of an alkaline earth metal, and a salt of a transition metal, wherein at least one of the salts is a fluoride-containing salt. The precursor components are converted into an oxide superconductor by treating the precursor film to form an intermediate metal oxyfluoride film including the rare earth, the alkaline earth metal, and the transition metal of the precursor solution, and thereafter converting the oxyfluoride film into an oxide superconductor.

The smaller the gap between filaments, the greater the target surface coverage with HTS filament and the higher the critical current density of the device. However, the gap dimension is limited by the accuracy and precision of the deposition technique, as significant contact between adjacent filaments is to be avoided when reducing ac losses. Dropwise deposition techniques represent an attractive method for accurately depositing material on a fine scale. Filaments can be deposited with a resolution approaching the size of the liquid droplets, e.g., 10-20 µm. It is therefore possible to form filaments having a narrow gap between adjacent filaments. In one or more embodiments, a precursor solution is deposited dropwise to form an array of filaments having a gap in the range of about 10 to 100 µm, or for example, less than 50 µm. The filaments are typically about 50 to 1000 µm wide, or typically about 100 µm. In one or more embodiments, the filament array includes filaments of less than about 100 µm wide separated by a gap of about 10 to 20 µm. This represents a high utilization of conductor cross-section in the HTS layer, which translates into a higher engineering current density ($J_e$).

Figure 4:
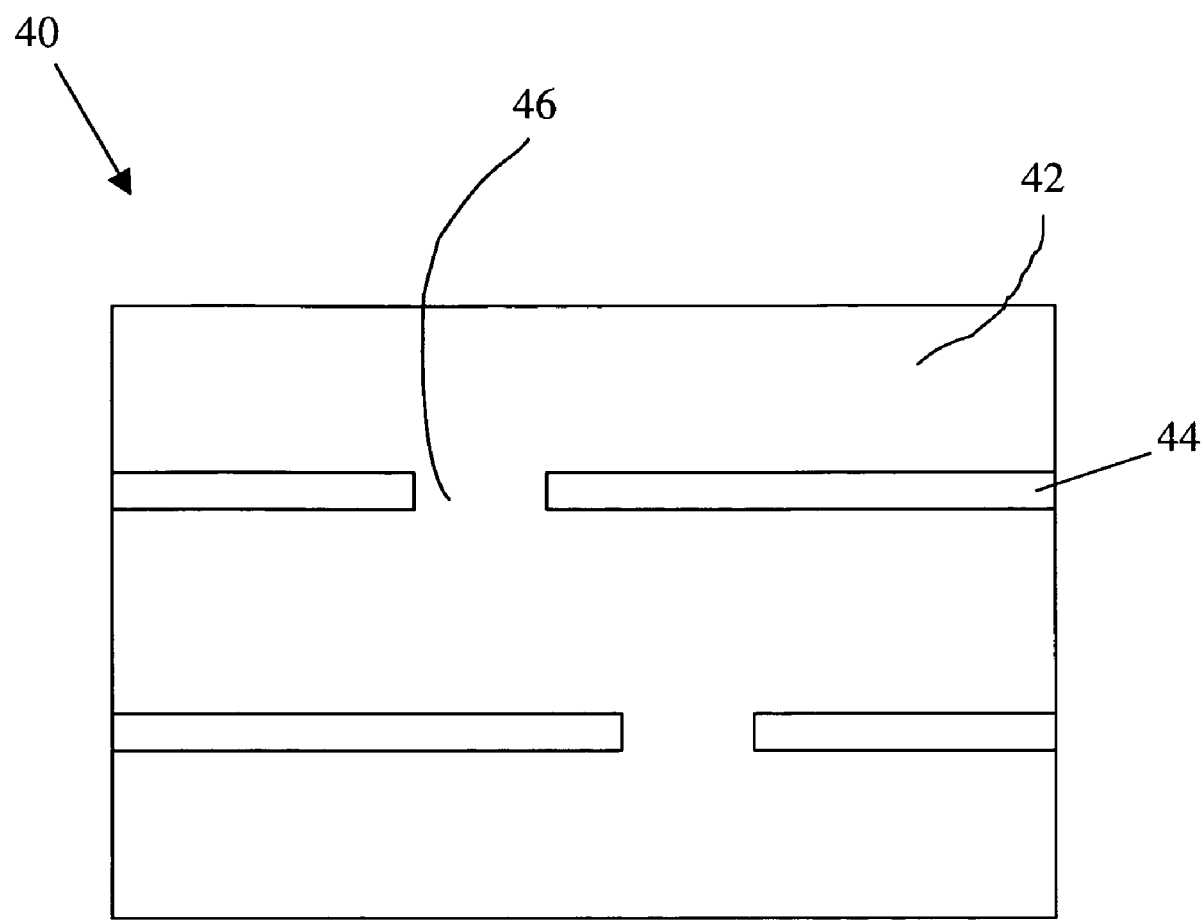
FIG. 4 is a schematic top view of a second generation HTS wire architecture according to one or more embodiments of the invention.

Dropwise deposition enables the method to put down material at any point on the target substrate. Thus, material can be deposited within the gaps or spacings between the filaments of the filament array. For example, additional precursor solution is deposited at random or periodic intervals to form superconducting bridges between adjacent filaments. Periodic bridges provide current continuity from filament to filament and offset defects that periodically arise in the superconducting material. FIG. 4 is a top view of a coated conductor architecture 40 having an array of continuous filaments 42 separated by gaps 44. The architecture includes periodic bridges 46 that span the gap.

A plurality of dispensing devices (optionally having a plurality of nozzles or nozzle orifices) may be used to deposit different material compositions sequentially or concurrently with the deposition of the superconductor precursor solution. For example, a second dispensing device is employed to deposit a second material into the gap resulting from the deposition of adjacent filaments. The second material can be a conducting material or precursor thereto, which is deposited at intervals in the gap between filaments to form, for example, a conductive bridge. Alternatively, the second material is an insulating material, a poorly conductive material, or a medium to high resistivity material or precursor thereto that is selected to mechanically isolate the adjacent filaments and/or to increase resistivity between the filaments and/or improve the electrical stability of the article.

In one or more embodiments, the second material is an insulating material, e.g., ceramic materials such as barium zirconate or HTS superconductor that has been poisoned by the additional of a metal contaminant, e.g., zinc-contaminated YBCO or $PrBa_2Cu_3O_{7-x}$. $PrBa_2Cu_3O_{7-x}$ has the added advantage of having a lattice structure similar to that of YBCO, so that it can be textured in a manner similar to YBCO. The second material may be a material that is not superconducting and that is a poor conductor, e.g., an amorphous YBCO or a doped manganese oxide. The second material can be a high or medium resistivity material. The second material can be a material that reacts with a superconductor to poison the superconductor.

Figure 5:
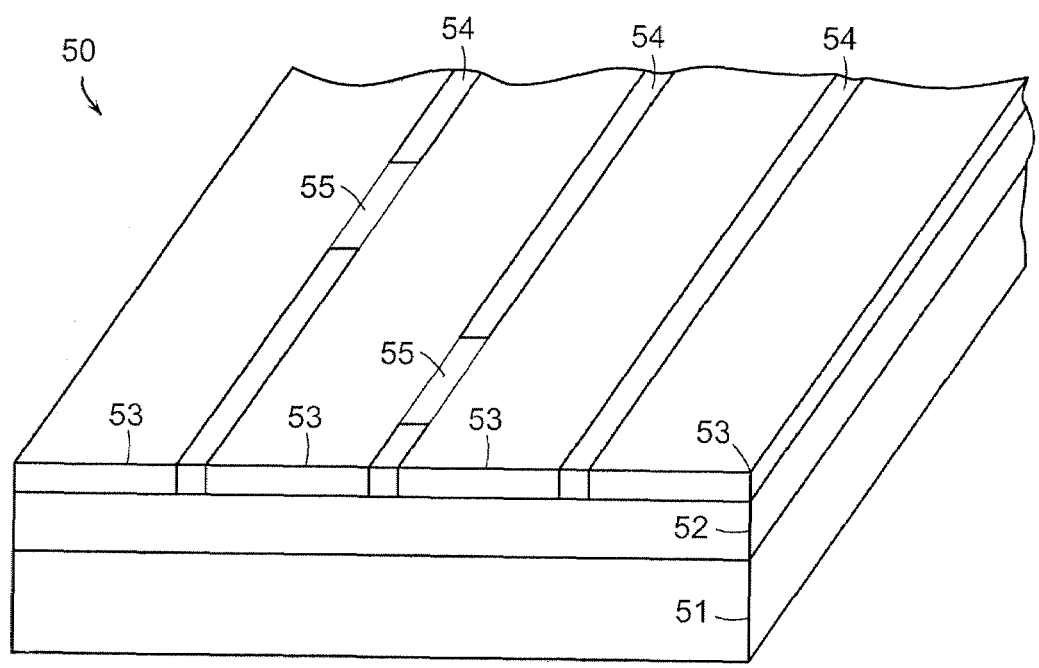
FIG. 5 is a perspective view of a second generation HTS wire architecture according to one or more embodiments of the invention.

FIG. 5 is a cross-sectional view of a coated conductor article, in which the YBCO film is arranged as a thin filament array including interleaved barrier filaments. The multilayer article 50 includes a metal substrate 51 having a textured surface and epitaxially grown buffer layer(s) 52. Superconductor filaments 53 run substantially continuously along the length of the tape and form an array of substantially parallel filaments. Barrier filaments 54 occupy the gap between superconducting filaments 53. Optional bridges 55 of superconducting or conducting material connect adjacent superconducting filaments. The barrier material is deposited concurrent with the superconducting material from a second dispenser. Alternatively, the barrier material is deposited subsequently, for example, in a second pass of the article through the deposition process.

In one or more embodiments, a superconductor layer is deposited in a first pass of the dropwise deposition process. In a second pass, a second material is deposited on the superconducting layer and reacted with the underlying superconducting layer to form an insulating, poorly conducting or medium or high resistivity layer. The second material can be put down in a pattern to form barrier regions interleaved between superconducting filaments.

Figure 10:
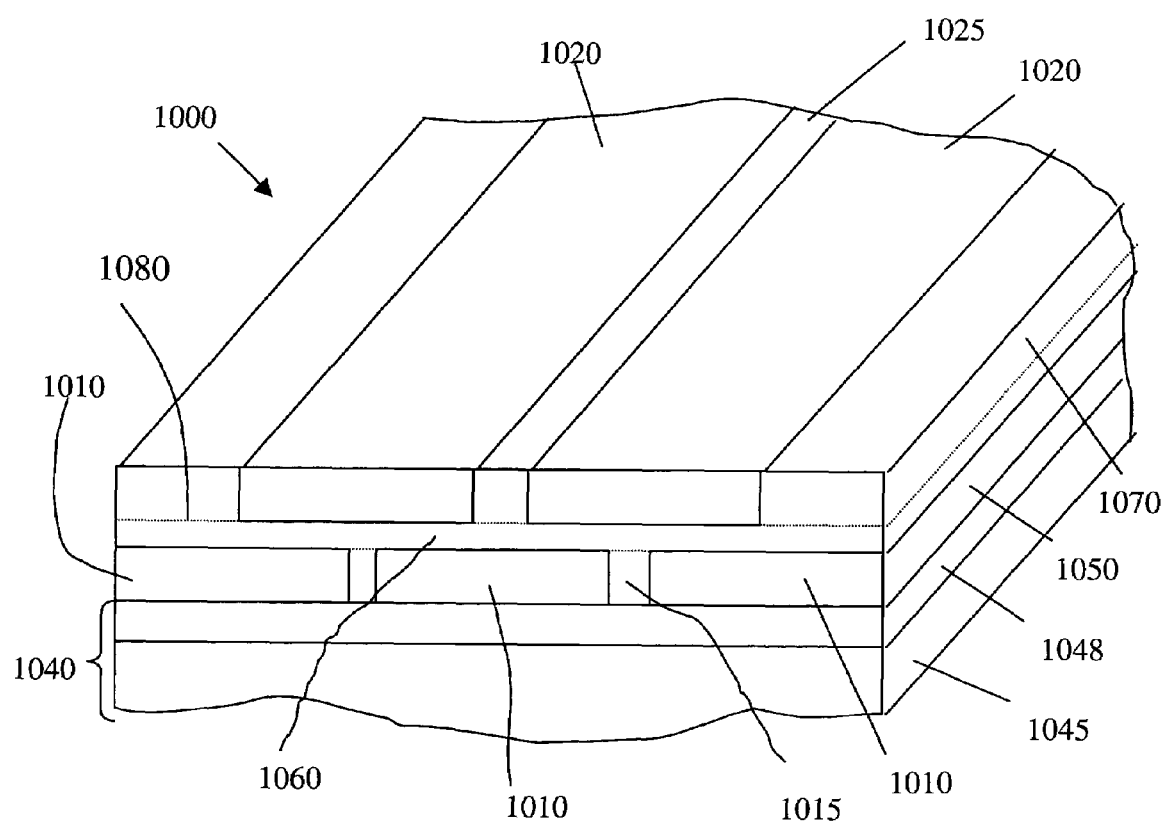
FIG. 10 is an illustration of a further embodiment of the present invention.

FIG. 10 illustrates another embodiment of the invention, in which multiple dropwise deposition passes are used to provide multiple layers of oxide superconductor in a desired pattern. The pattern for each layer of oxide superconductor may vary. FIG. 10 shows a structure 1000 having two superconducting layers 1050, 1070 contain superconducting filaments 1010, 1020, respectively. Layers 1050, 1070 are separated by a separator layer 1060, all of which are deposited on a textured base 1040 having a metal substrate 1045 and buffer layer(s) 1048. In a first deposition step, layer 1050 is formed by dropwise deposition of suitable precursor materials to provide filaments 1010 and a second filler material 1015 that fills any space not occupied by filaments 1010. In a second deposition step, a separator layer 1060 is deposited to separate the lower layer filaments 1010 from subsequently deposited filaments 1020. The layer 1060 is of a thickness to provide the appropriate isolating effect between filaments 1010 and 1020. In a third deposition step, filament 1020 and a second material 1025 are deposited to form layer 1070. Material 1025 is deposited to fill any space not occupied by filament 1020. Materials 1015, 1060 or 1025 may be the same or different. They may form a continuous material that separates the two filaments, and the boundaries between the layers are therefore shown using a dotted line 1080. This stepwise process allows one to build up a complex three-dimensional pattern of oxide superconductor on the wire or tape.

In one or more embodiments layer 1060 serves as a common barrier layer that shares current among the filaments. Layer 1060 is disposed between layer 1050 and 1070. To reduce interfilamentary coupling losses (currents run perpendicular to the wire or tape direction, from filament-to-filament, through the metal stabilizer) the barrier can a conductive material with medium to high resistivity. Exemplary medium resistivity materials include, for example, conductive oxides, e.g., $La(Sr)MnO_3$. Manganese oxides are inherently medium to high resistivity materials. Doping, e.g., by an alkaline earth element increases conductivity. Furthermore, such materials can be epitaxially grown with a lattice structure similar to YBCO.

Figure 6A:
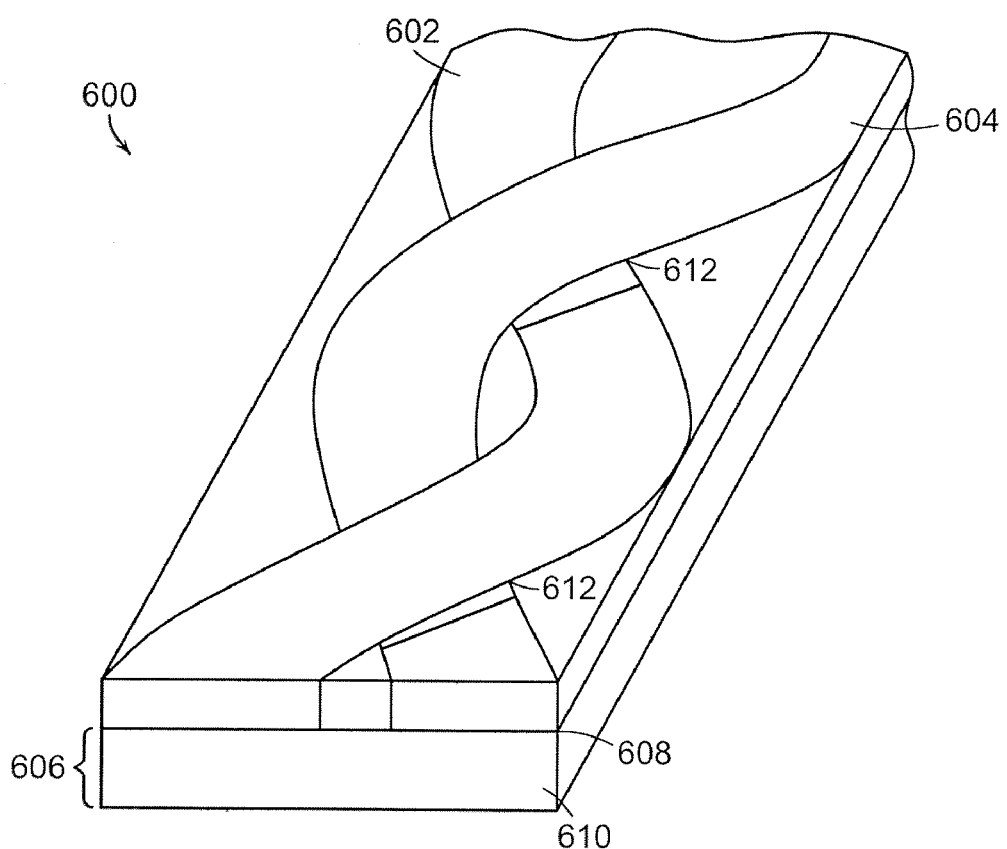
FIGS. 6A and B are perspective views of a second generation HTS wire having transposed filaments.
Figure 6B:
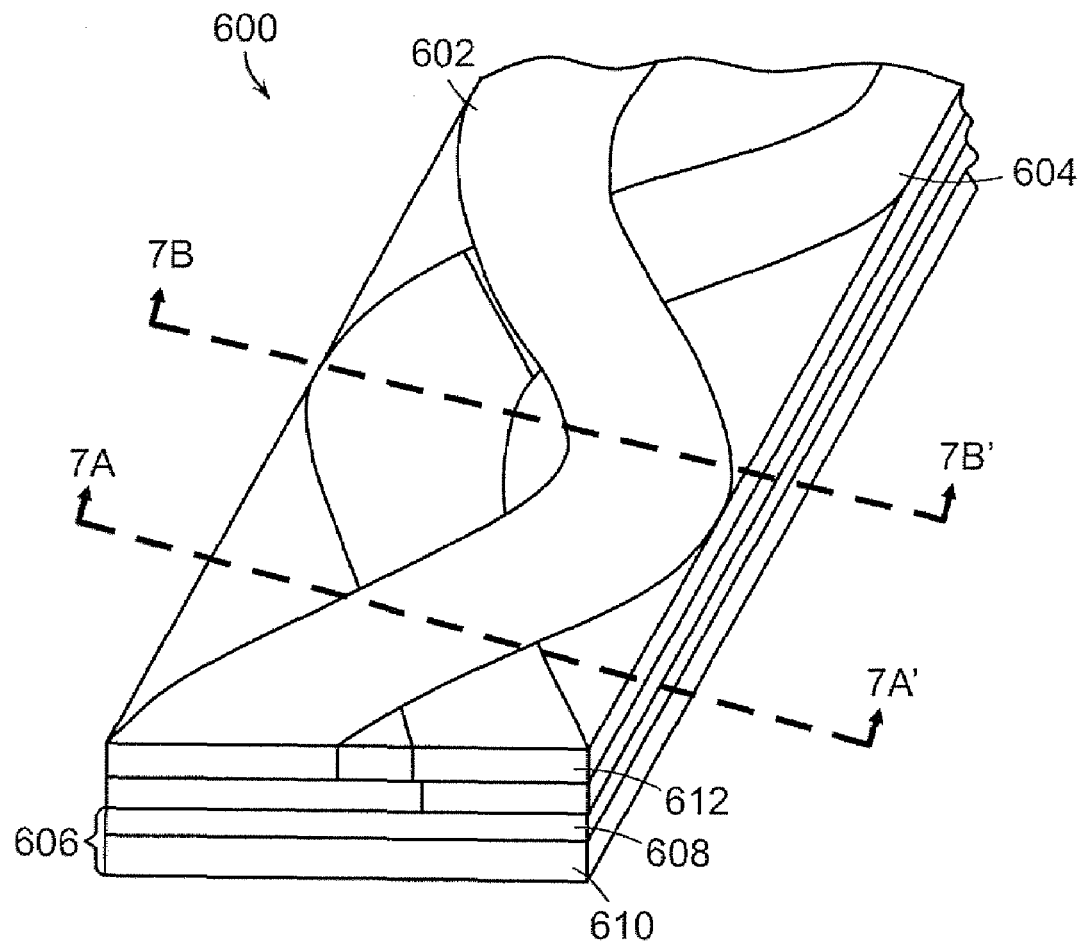

FIG. 6A and FIG. 6B illustrate other embodiments of the present invention. As noted above, transposed superconductor filaments are used to reduce ac losses. Transposition is typically achieved by twisting the coated conductor after the superconductor layer is deposited. Using dropwise deposition of patterned superconductor, transposed filaments can be deposited on the active layer without having to twist the coated conductor. Two-filament device 600 illustrates this design. Filaments 602, 604 are deposited on a textured base 606 having a metal substrate 608 and buffer layer(s) 610. In order to prevent shorting between filaments, a barrier material, e.g., an insulating, poorly conducting, or medium or high resistivity material 612 is interposed between the filaments. The filaments are deposited in a pattern that results in the crossover or overlap of filaments. The filaments may alternate crossover, so that a first filament 602 crosses over the second filament 604 in a first junction, and then second filament 604 crosses over first filament 602 in a second junction. See FIG. 6A.

The material 612 may be localized and located primarily at the junction between two overlapping filaments as illustrated in FIG. 6A. The material 612 may substantially surround the filaments along their length as illustrated in FIG. 6B. The material 612 may also serve as a matrix into which the filaments are embedded. The wire can be about 1-10, or about 2-4 mm wide. Each of these (and other) structures is readily obtained using dropwise deposition of suitable starting solutions.

Filaments are shown here for illustrative purposes as a sinusoidal curve, however any pattern may be used. In some embodiments, more than two filaments are employed in the device. In addition, a filament may overlap with one or more filaments to form the low ac loss pattern. Suitable patterns will be readily apparent to those of skill in the art.

In one or more embodiments, the filaments are substantially on the same plane except for approaching and at the filament junctions. The superconducting layer is dropwise deposited from a dispenser containing a precursor solution to the oxide superconductor and a barrier material solution. The dispenser tracks across the width of the substrate, depositing materials associated with filament 602, then barrier material 612, and then filament 604. Once deposited, the substrate is advanced lengthwise to a new location where materials associated with filament 602, barrier layer 612 and filament 604 are again deposited. As the dispenser approaches a location on the substrate for a filament cross over, the distance between the two filaments narrows. At the junction, filament 602 is deposited and barrier layer 612 is deposited over filament 602. After a sufficient barrier layer is deposited over filament 602, filament 604 is deposited. Beyond the junction, the two filaments are again deposited directly onto the underlying substrate.

Figure 7A:
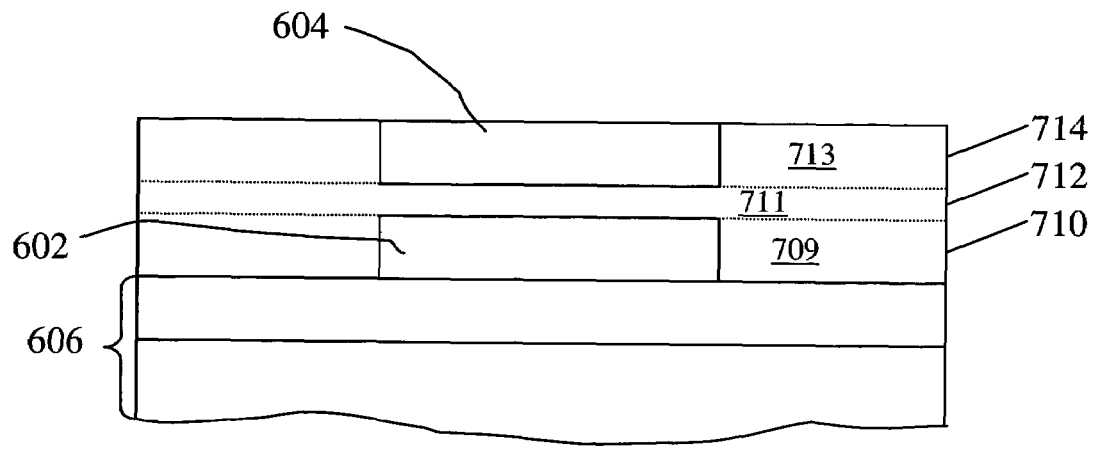
FIGS. 7A and 7B are cross-sectional illustrations of an embodiment of the present invention illustrated in FIG. 6B.
Figure 7B:
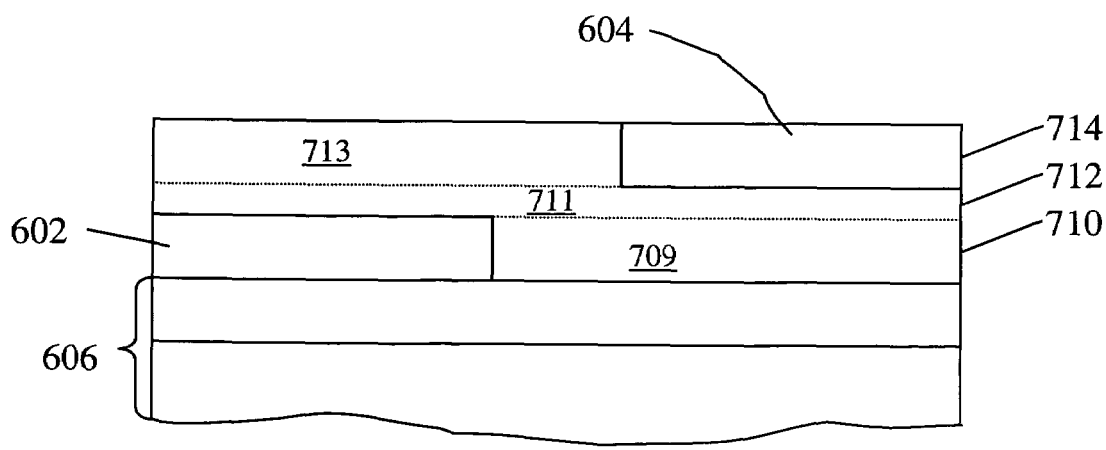

FIG. 7A illustrates a cross-section of the coated conductor of FIG. 6B at line 7A-7A', where the two filaments 602, 604, occupy a different plane in the superconducting layer. Interposed between the two filaments is a layer of material that isolates the two filaments and prevents shorting. FIG. 7B illustrates a cross-section of the coated conductor of FIG. 6 at line 7B-7B', where the two filaments 602, 604 are spaced apart from each other on the substrate 606 of the coated conductor. Material is in contact with each filament and isolates the two filaments 602, 604 from one another.

The filaments 602, 604 can be deposited using dropwise deposition of precursor materials using 3D printing techniques described above that enable the sequential deposition of multiple layers. Referring again to FIGS. 7A and 7B, in a first deposition step filament 602 and a high resistivity or insulating material 709 are deposited to form layer 710 by dropwise deposition of suitable precursor materials. Precursor solutions may not be required to deposit the barrier material used in layers 710, 712, and 714. The poorly conducting, or medium or high resistivity or insulating material, used as the barrier material may be dropwise deposited from a slurry or suspension of the final insulating or high resistivity material can directly deposited. Material 709 is deposited to fill any space not occupied by filament 602. In a second deposition step, a layer of a poorly conducting, or medium or high resistivity or insulating material 711 is deposited to form layer 712. The layer 712 is of a thickness to provide the appropriate isolating effect between filaments 602 and 604 at their closest approach, and may vary in thickness from layers 710 and 714. In a third deposition step, filament 604 and a poorly conducting, or medium or high resistivity or insulating material 713 are deposited to form layer 714. Material 713 is deposited to fill any space not occupied by filament 604. Materials 709, 711 or 713 may be the same or different. They may form a continuous material that separates the two filaments, and the boundaries between the layers are therefore shown using a dotted line.

A wide range of dispensing devices can be used to dispense the precursor solution. A dispensing device may include an inkjet print head, liquid droplet generator, extrusion device, gear pump, air pressure pump, positive displacement pump, screw-driven pump, syringe pump, fused deposition modeling nozzle or a combination thereof. These devices are well known in the art of liquid dispensing.

In one or more embodiments, an inkjet printer is used to dropwise deposit the precursor solution. Inkjet printer technology provides continuous deposition of long lengths of superconductor material on moving substrates. Any desired distribution of interfilament bridges is achievable and can be precisely applied. Both the spacing between filaments and the distribution of bridges can be precisely controlled using computer control, as is currently employed in conventional inkjet printing. An appropriate insulator material (or other second material) is deposited in the interfilament gaps using, for example, an additional set of printer heads with a second insulator solution. Droplets with spot sizes as small as 10 μm in the lateral dimension have been created by inkjet methods, which provides adequate interfilament resolution. The current capability of the technology, e.g., line width and spatial resolution, is within the ranges useful for the deposition of superconducting thin film arrays. Resolution is dependent on and can be modified by controlling solution viscosity, solution spread (wettability), substrate absorption properties, deposition environment and substrate heating.

There are at least two different inkjet printer technologies that can be used to generate droplets for deposition of a patterned oxide superconductor thin film—continuous inkjet (CIJ) printing and drop-on-demand (DOD) inkjet printing. Continuous inkjet printing projects a continuous stream of liquid from a small orifice and through an external electric field. As the liquid stream breaks up into small droplets, they retain an electric charge, which is used to direct them in a desired direction. Drop on demand printing forms individual droplet only as required, which are dropped onto the substrate in the desired location. Droplets are normally formed using a thermal or piezoelectric actuator.

A suitable precursor solution includes a solution having a viscosity capable of generating a selected range of droplet sizes within a selected deposition rate. Exemplary solutions include solutions having a viscosity (at deposition temperature) of less than 20 cP. Suitable solutions also include solvents that do not dissolve or chemically interact with the printer head components. The precursor solution is also selected to be stable under the high mechanical shear of a piezoelectric actuator or the high-temperature conditions of a thermal head. In addition, multiple pass printing can be employed. Multiple pass printing is useful, for example, when the concentration and/or solvent type selected to satisfy the viscosity criteria of the ink results in an ink that is dilute in superconductor components. In addition, alternative print head styles and/or modified orifice dimensions and shapes can be used to obtain specific printing requirements. For example, the drop velocity, drop mass, operating voltage and frequency response can be controlled in a piezoelectric-driven drop-on-demand inkjet printer head.

Figure 8:
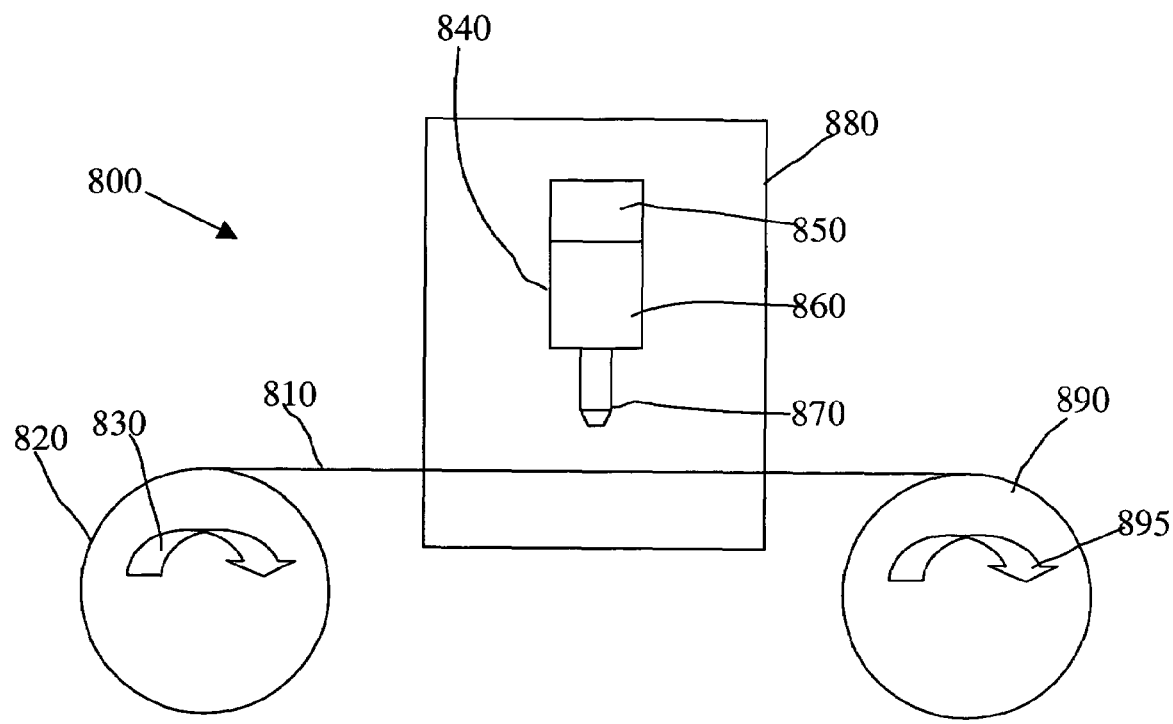
FIG. 8 is a schematic illustration of a system used to deposit a patterned thin film of an oxide superconductor according to one or more embodiments of the invention.

FIG. 8 is a schematic illustration of a deposition system 800 used to deposit a patterned HTS film. A wire or tape 810 for receiving the patterned superconductor layer is typically provided as long lengths wound on a mandrel 820 or appropriate storage base. The mandrel is driven, as indicated by arrow 830, continuously or intermittently, to advance the wire or tape to various locations with the deposition system.

The tape can be wound on a reel and transferred to a second reel such that during the transfer process that tape passes under the printer head. In one configuration, the printer head consist of multiple nozzles that extend across the width of the tape that dispense the precursor in the desired pattern across the full width of the tape as it is moved under the printer head. In another configuration, the printer head consists of one or more nozzles that extend across a fraction of the tape width. In this configuration, the printer head is moved across the tape in a coordinated movement with linear tape movement to generate the desired pattern across the full width and along the length of the tape. In another configuration, the tape is attached to a movable support that is moved under the printer head to generate the desired pattern.

The system also includes a dropwise dispensing device 840, which is typically an inkjet printhead. The dispensing device includes a reservoir 850 where the precursor solutions are housed and a dispensing head 860 for generating droplets of the precursor solution. The dispensing head further includes a nozzle or orifice 870 for ejecting droplets for deposition onto a receiving surface of the wire. During the dispensing process, the wire is moved past the dispensing head; the dispensing head may also be capable of movement. The receiving surface and dispensing head are moved (preferably under the direction of a computer and controller) (not shown) with respect to each other along selected directions in a predetermined pattern. The dispensing head may be designed to include a plurality of discharge orifices. Inkjet printheads containing several hundred to several thousand discharge orifices are commercially available. Alternatively, the dispensing device may include a plurality of dispensing heads, each having one or more discharge orifices. Use of multiple dispensing heads permits the use of different precursor solutions and deposition of different materials on the target substrate. An exemplary printhead provides ~22 μm×~5.3 μm sized dots and has a resolution of 1200×1200 dpi and 4800×1200 dpi for conventional black and white and color printing, respectively.

The dispensing device may be contained within an enclosed environment 880, or it may be further equipped with fans or other means for controlling the vapor pressure above the deposited layer to assist in the drying of the precursor solution (not shown).

The wire with the as-deposited layer may then be taken-up by a take-up mandrel 890 (driven as indicated by arrow 995), where it is stored until subsequent processing into an oxide superconductor. Alternatively, the wire can be advanced into a heater (not shown) for conversion of the precursor components into an oxide superconductor.

Figure 9:
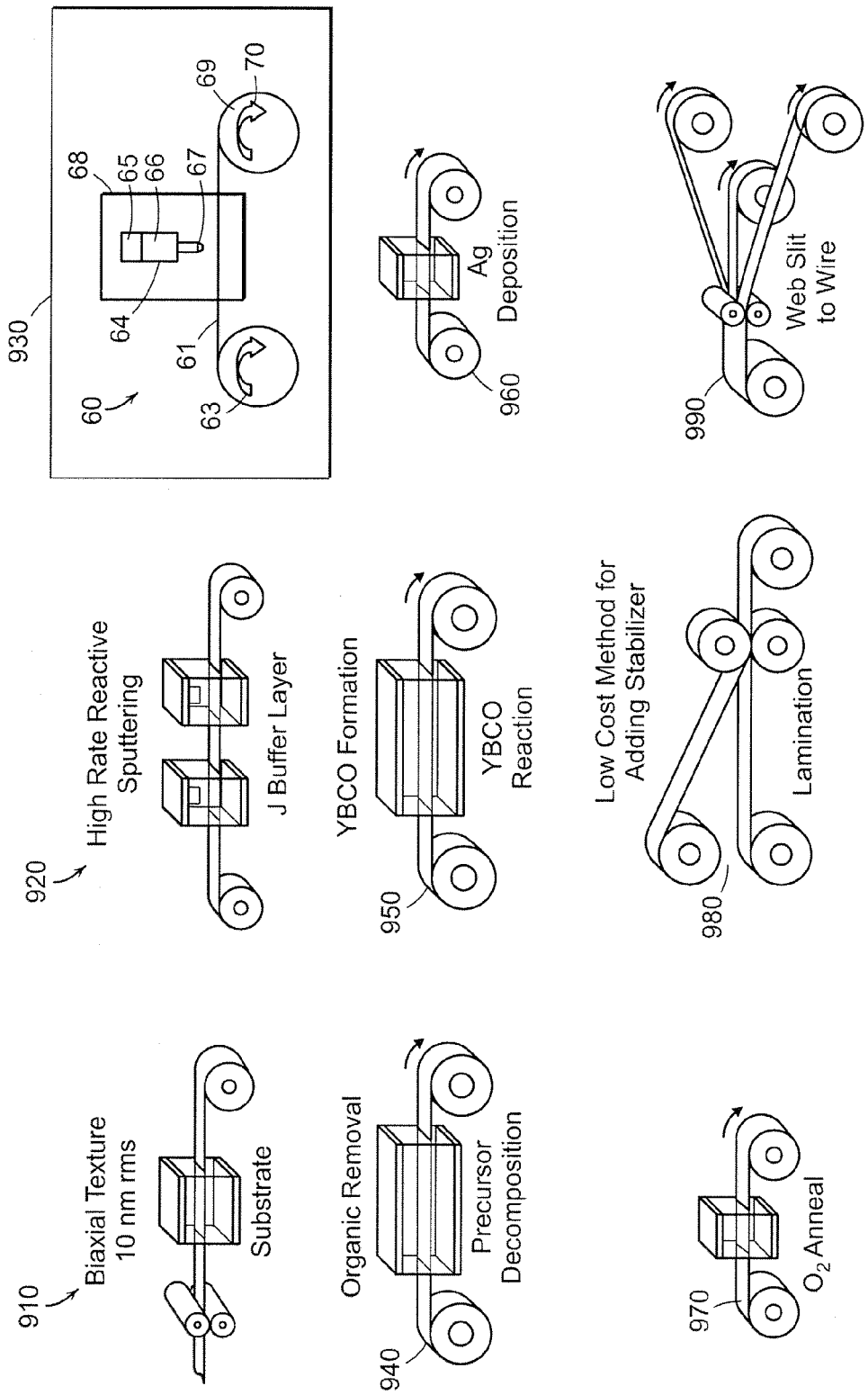
FIG. 9 is a schematic illustration of a system and process used to prepare a textured, patterned oxide superconductor wire according to one or more embodiments of the invention.

The dropwise deposition of patterned precursor materials is readily integrated into current coated conductor manufacturing processes. A typical coated conductor manufacturing process is shown in FIG. 9. In the current inkjet printing process of a patterned superconductor layer, conventional a whole-substrate coating station (typically by a slot die technique) is replaced by an inkjet printing station. Description of printing a precursor film on a textured template having the architecture $CeO_2/YSZ/Y_2O_3/NiW$ is described. The textured template is provided in widths of about 1 to 4 cm.

As shown in FIG. 9, at a first station 910, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850°

C.). The pressure of the hydrogen (or hydrogen/inert gas mixture) can be relatively low (e.g., less than about one torr, less than about $1 \times 10^{-3}$ torr, less than about $1 \times 10^{-6}$ torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface.

In a second processing station 920, a buffer layer is formed on the textured substrate. The buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a patterned precursor solution is deposited at an inkjet printing station 930 as described above.

At a subsequent station 940, the precursor components are decomposed. The conversion of the patterned precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired superconductor layer at a further processing station 950. Typically, this step is performed by heating from about room temperature to a temperature of from about 700° C. to about 825° C., preferably to a temperature of about 740° C. to about 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature at in a nominal gas environment with an oxygen pressure of about 0.05 Torr to about 150 Torr, preferably about 0.1 Torr to about 0.5 Torr and more preferably from about 0.1 Torr to about 0.2 Torr.

The resultant superconductor layer is well-ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

Further processing by noble metal deposition at station 960, oxygen anneal at station 970, lamination at station 980 and slitting at station 990 complete the process, thereby allowing for the low cost fabrication of low ac loss coated conductor wires.

Incorporation By Reference

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefor," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. patent application Ser. No. 09/579,193, filed on May 26, 2000, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. patent application Ser. No. 10/208,134, filed on Jul. 30, 2002, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same," and commonly owned U.S. patent application Ser. No. 09/615,999, filed on Jul. 14, 2000, and entitled "Superconductor Articles and Compositions and Methods for Making Same;" and U.S. Provisional Application No. 60/477,613, filed Jun. 10, 2003, and entitled "Superconductor Methods and Reactors;" and U.S. Utility application Ser. No. 10/858,309, filed Jun. 4, 2004, and entitled "Superconductor Methods and Reactors," all of which are hereby incorporated by reference.

What is claimed is:

1. A method of preparing a superconducting article, comprising:
   a. providing a precursor solution comprising precursor components to a rare earth-alkaline earth metal-transition metal oxide solubilized in one or more solvents;
   b. depositing the precursor solution as droplets onto a target surface in a pre-determined pattern, said target surface comprising a textured surface of a wire, wherein the precursor solution is deposited to form an array of filaments extending substantially continuously along the length of the wire; and
   c. converting the deposited precursor solution into an oxide superconductor.

2. The method of claim 1, wherein the filaments are substantially parallel.

3. The method of claim 1, wherein the filaments are transposed.

4. The method of claim 1, wherein the filaments have curvature.

5. The method of claim 1, wherein the filaments have a width in the range of about 20 to 1000 µm and a length extending substantially the entire length of the substrate.

6. The method of claim 5, wherein the filaments of the filament array are spaced apart to form a distance between adjacent filaments in the range of about 10 to 100 µm.

7. The method of claim 1, wherein the filaments are isolated from each other.

8. The method of claim 1, further comprising:
   depositing the precursor solution as droplets to form at least one superconducting bridge between adjacent filaments of the filament array.

9. The method of claim 8, wherein the bridges are periodically located along the length of adjacent filaments of the filament array.

10. The method of claim 1, further comprising:
    depositing a second solution as droplets to form at least one bridge between adjacent filaments of the filament array, said second solution comprising a conductive component or precursor thereto.

11. The method of claim 10, wherein the bridges are periodically located along the length of adjacent filaments of the filament array.

12. The method of claim 1, further comprising:
    depositing a second solution comprising a second material between at least two adjacent filaments of the filament array.

13. The method of claim 12, wherein the second material is selected from the group consisting of an insulating material, a material having a resistivity sufficient to reduce coupling losses caused by currents flowing perpendicular to the wire, and precursors thereto.

14. The method of claim 1 wherein the filaments are periodically interrupted along the length of the superconducting article.

15. The method of claim 1 wherein the filaments are transposed along the width of the superconducting article.

* * * * *

UNITED STATES PATENT AND TRADEMARK OFFICE
CERTIFICATE OF CORRECTION

| | | |
|---|---|---|
| PATENT NO. | : 7,582,328 B2 | Page 1 of 1 |
| APPLICATION NO. | : 10/955866 | |
| DATED | : September 1, 2009 | |
| INVENTOR(S) | : Rupich et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 792 days.

Delete the phrase "by 792 days" and insert -- by 1323 days --

Signed and Sealed this

First Day of June, 2010

David J. Kappos
*Director of the United States Patent and Trademark Office*